(12) United States Patent
Manian et al.

(10) Patent No.: US 11,539,555 B2
(45) Date of Patent: Dec. 27, 2022

(54) ENHANCED DISCRETE-TIME FEEDFORWARD EQUALIZER

(71) Applicant: TEXAS INSTRUMENTS INCORPORATED, Dallas, TX (US)

(72) Inventors: Abishek Manian, San Jose, CA (US); Ashwin Kottilvalappil Vijayan, Austin, TX (US); Amit Rane, Santa Clara, CA (US); Ashkan Roshan Zamir, Santa Clara, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 232 days.

(21) Appl. No.: 17/095,869

(22) Filed: Nov. 12, 2020

(65) Prior Publication Data

US 2021/0409246 A1 Dec. 30, 2021

Related U.S. Application Data

(60) Provisional application No. 63/045,496, filed on Jun. 29, 2020.

(51) Int. Cl.
*H04L 25/03* (2006.01)
*H03F 3/45* (2006.01)
(Continued)

(52) U.S. Cl.
CPC ........ *H04L 25/03261* (2013.01); *G05F 1/561* (2013.01); *G11C 27/026* (2013.01);
(Continued)

(58) Field of Classification Search
CPC ......... H04L 25/03261; H04L 25/03133; H04L 25/0314; H03H 17/06; H03F 3/183;
(Continued)

(56) References Cited

U.S. PATENT DOCUMENTS 3,879,664 A 4/1975 Monsen
7,321,621 B2 1/2008 Popescu et al.
(Continued)

OTHER PUBLICATIONS

International Search Report in corresponding PCT Application No. PCT/US2021/039486, dated Oct. 7, 2021 (2 pages).
(Continued)

*Primary Examiner* — Patrick C Chen
(74) *Attorney, Agent, or Firm* — John R. Pessetto; Frank D. Cimino

(57) ABSTRACT

An N-tap feedforward equalizer (FFE) comprises a set of N FFE taps coupled together in parallel, a filter coupled between the (N−1)th FFE tap and the Nth FFE tap, and a summer coupled to an output of the set of N FFE taps. Each FFE tap includes a unique sample-an-hold (S/H) circuit that generates a unique time-delayed signal and a unique transconductance stage that generates a unique transconductance output based on the unique time-delayed signal. The filter causes the N-tap FFE to have the behavior of greater than N taps. In some examples, the filter is a first order high pass filter that causes coefficients greater than N to have an opposite polarity of the Nth coefficient. In some examples, the filter is a first order low pass filter that causes coefficients greater than N to have the same polarity as the Nth coefficient.

22 Claims, 3 Drawing Sheets

(51) Int. Cl.
   *H03H 17/06* (2006.01)
   *G11C 27/02* (2006.01)
   *G05F 1/56* (2006.01)
   *H03H 11/04* (2006.01)
   *H03F 3/183* (2006.01)

(52) U.S. Cl.
   CPC ......... *H03F 3/183* (2013.01); *H03F 3/45089* (2013.01); *H03H 11/0427* (2013.01); *H03H 17/06* (2013.01); *H04L 25/03076* (2013.01)

(58) Field of Classification Search
   CPC .. H03F 3/45103; H03F 3/45107; G05F 1/561; G11C 27/026
   See application file for complete search history.

(56) References Cited

U.S. PATENT DOCUMENTS

| | | | |
|---|---|---|---|
| 8,548,110 B2 | 10/2013 | Lin et al. | |
| 8,743,943 B2 | 6/2014 | Shumarayev et al. | |
| 8,964,826 B2 | 2/2015 | Agrawal et al. | |
| 9,100,555 B2 | 8/2015 | Wang et al. | |
| 9,210,008 B2 | 12/2015 | Rane | |
| 9,692,589 B2 | 6/2017 | Iyer et al. | |
| 9,935,839 B2 | 4/2018 | Li et al. | |
| 10,305,704 B1 | 5/2019 | Kenyon | |
| 10,523,218 B2 | 12/2019 | Kuan et al. | |
| 10,659,337 B2 | 5/2020 | Riani et al. | |
| 2007/0052849 A1 | 3/2007 | Craddock et al. | |
| 2009/0182531 A1 | 7/2009 | Ekkizogloy et al. | |
| 2013/0208779 A1* | 8/2013 | Agrawal | H04L 27/01 375/232 |
| 2014/0140385 A1 | 5/2014 | Ye et al. | |
| 2015/0180587 A1 | 6/2015 | Kalogerakis et al. | |
| 2016/0217872 A1 | 7/2016 | Hossain et al. | |
| 2018/0262374 A1* | 9/2018 | Cheng | H03F 3/45201 |
| 2019/0044760 A1 | 2/2019 | Chiang et al. | |
| 2019/0363869 A1 | 11/2019 | Li et al. | |
| 2020/0409444 A1 | 12/2020 | Delshadpour et al. | |
| 2021/0021448 A1* | 1/2021 | Beukema | H04L 25/0272 |

OTHER PUBLICATIONS

Office Action in related U.S. Appl. No. 17/083,008, dated Jan. 28, 2022, 31 pgs.
Final Office Action in related U.S. Appl. No. 17/083,008, dated Jun. 9, 2022, 11 pgs.
International Search Report in corresponding PCT Application No. PCT/US2021/038220, dated Oct. 14, 2021 (2 pages).

* cited by examiner

ENHANCED DISCRETE-TIME FEEDFORWARD EQUALIZER

CROSS-REFERENCE TO RELATED APPLICATION

This application claims priority to U.S. Provisional Application 63/045,496, filed Jun. 29, 2020, titled "Enhanced Discrete-Time Feedforward Equalizer (FFE)," which is hereby incorporated by reference in its entirety.

BACKGROUND

Equalization is a process of conditioning an electrical signal, either at the transmitter or the receiver to compensate for channel-induced inter-symbol-interference (ISI) and improve signal integrity. Feedforward equalization (FFE) is a common equalization technique that employs a finite impulse response (FIR) filter with a series of tap weights programmed to adjust the impulse and frequency response of the signal. Performance of an FFE corresponds to the number of taps implemented. However, FFE taps can consume large amounts of power, such that improving an FFE's performance comes at the cost of increased power consumption.

SUMMARY

A feedforward equalizer (FFE) comprises a set of N FFE taps coupled together in parallel, a filter coupled between the (N−1)th FFE tap and the Nth FFE tap, and a summer coupled to an output of the set of N FFE taps. Each FFE tap includes a unique sample-and-hold (S/H) circuit that generates a unique time-delayed signal and a unique transconductance stage configured to generate a unique transconductance output based on the unique time-delayed signal. The filter coupled between the (N−1)th FFE tap and the Nth FFE tap cause the FFE to have the behavior of greater than N taps.

In some implementations, the filter is a first order high pass filter, and coefficients greater than N have an opposite polarity to an Nth coefficient. In some implementations, the filter is a first order low pass filter, and coefficients greater than N have the same polarity as the Nth coefficient. In some implementations, a particular S/H circuit in a particular FFE tap comprises a first track-and-hold (T/H) circuit and a second T/H circuit. At least one of the first and second T/H circuits can include a preamplifier and a switched emitter follower.

In some examples, the preamplifier includes a degeneration capacitor, the capacitance of which is chosen to extend a bandwidth of the preamplifier. In some examples, the at least one of the first and second T/H circuits includes a feedforward capacitor coupled between the preamplifier and the switched emitter follower. The capacitance of the feedforward capacitor is chosen to reduce hold mode feedthrough. For the Nth S/H circuit, the preamplifier of the first T/H circuit can include the filter coupled between the (N−1)th FFE tap and the Nth FFE tap, such as a filtering capacitor.

BRIEF DESCRIPTION OF THE DRAWINGS

For a detailed description of various examples, reference will now be made to the accompanying drawings in which.

DETAILED DESCRIPTION

The disclosed N-tap feedforward equalizers can have the behavior of a greater than N-tap feedforward equalizer by including a passive filter before the Nth sample-and-hold (S/H) circuit. The filters create tails of the appropriate magnitude in the post cursor taps to mimic greater than N taps. Because the filter is passive, it does not consume any additional power. If the filter is a first-order high pass filter, the higher order coefficients greater than N have the opposite polarity of the Nth coefficient. If the filter is a first-order low pass filter, the higher order coefficients greater than N have the same polarity of the Nth coefficient. The filter can be any appropriate order of filter. In some examples, a preamplifier in a master track-and-hold (T/H) circuit of the Nth S/H circuit includes the filter.

Figure 1:
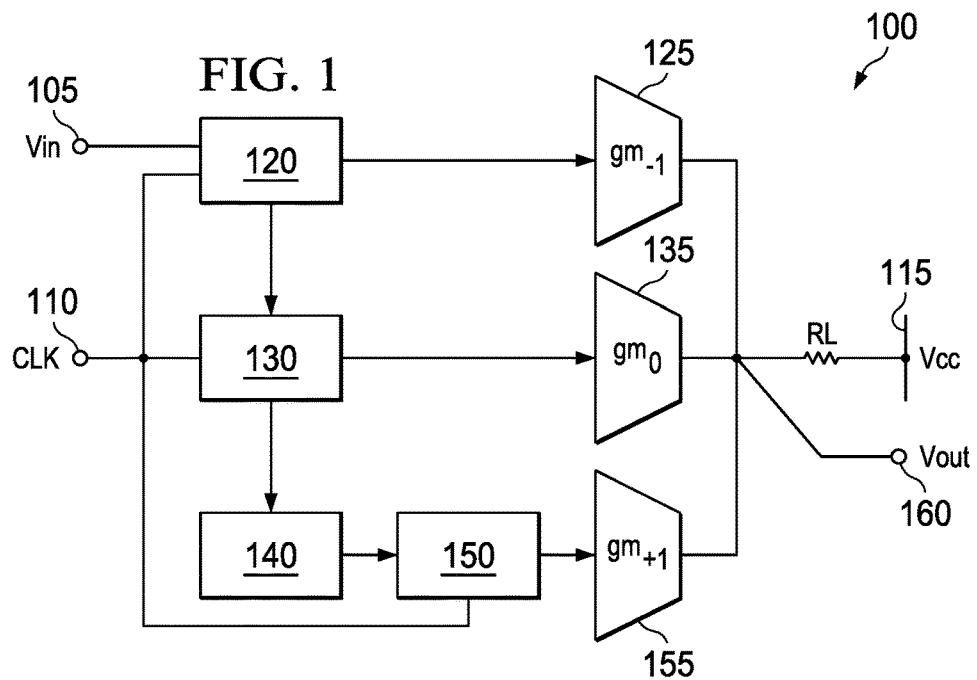
FIG. 1 illustrates a feedforward equalizer with extended taps.

FIG. 1 illustrates a feedforward equalizer 100 with extended taps. Feedforward equalizer 100 includes sample-and-hold (S/H) circuits 120, 130, and 150, a programmable filter 140, transconductance stages 125, 135, and 155, and resistor RL. S/H circuits 120, 130, and 150 receive a clock signal CLK 110. S/H circuit 120 also receives the input signal Vin 105. The output of S/H circuit 120 is provided to transconductance stage 125 and to S/H circuit 130. The output of S/H circuit 130 is provided to transconductance stage 135 and to filter 140. The output of filter 140 is provided to S/H circuit 150. The output of S/H circuit 150 is provided to transconductance stage 155.

The outputs of transconductance stages 125, 135, and 155 are coupled to resistor RL, which is further coupled to a supply voltage rail Vcc 115. The output signal Vout 160 is provided at the node where the outputs of transconductance stages 125, 135, and 155 are coupled to resistor RL. S/H circuit 120 and transconductance stage 125 comprise a precursor tap, S/H circuit 130 and transconductance stage 135 comprise a main tap, and S/H circuit 150 and transconductance stage 155 comprise a postcursor tap. In this example, the feedforward equalizer 100 is an N-tap feedforward equalizer, where N is equal to three. In other examples however, the feedforward equalizer 100 can have four or more taps by including additional S/H circuits.

The N-tap feedforward equalizer 100 can be enhanced to have the behavior of >N taps by creating tails of an appropriate magnitude in the postcursor tap with the filter 140. Filter 140 can be a passive filter, such that the inclusion of filter 140 in feedforward equalizer 100 does not substantially change the power consumption of feedforward equalizer 100. If filter 140 is a first order low pass filter, the higher-order coefficients greater than N have the same polarity as the Nth coefficient. If filter 140 is a first order high pass filter, the higher-order coefficients greater than N have the opposite polarity as the Nth coefficient. Filter 140 can be made programmable with variable resistors and capacitors and networks of resistors and capacitors with switches to couple and uncouple the networks.

Figure 2:
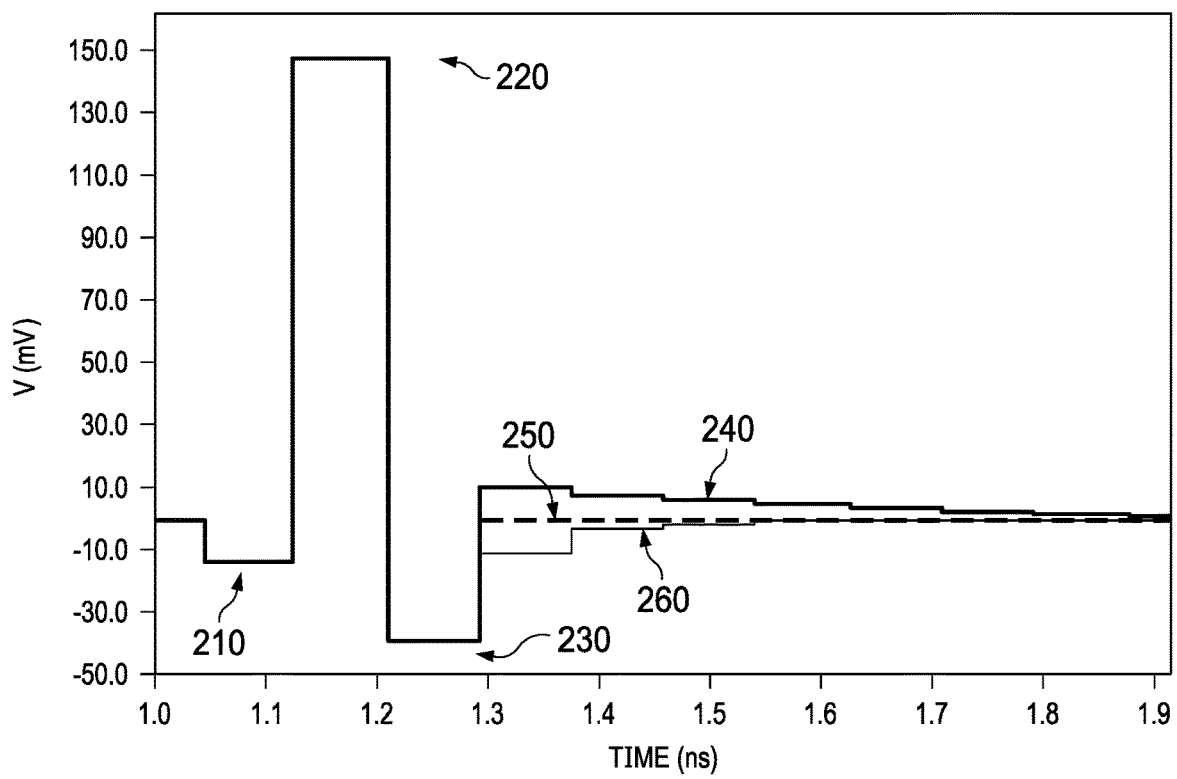
FIG. 2 shows a graph illustrating sample pulse responses for different filters in an ideal three-tap feedforward equalizer.

FIG. 2 shows a graph 200 illustrating sample pulse responses for different filters in the ideal three-tap feedforward equalizer 100 shown in FIG. 1. The pulse at time 210 corresponds to the precursor tap. The pulse at time 220 corresponds to the main tap. The pulse at time 230 corresponds to the first postcursor tap. The sample response 240 corresponds to a first order high pass filter 140, and the higher-order coefficients greater than three have the opposite polarity as the third coefficient. The sample response 250 corresponds to a filter 140 with a transfer function equal to one, with no additional taps. The sample response 260 corresponds to a first order low pass filter 140, and the higher-order coefficients greater than three have the same polarity as the third coefficient.

Filter 140 can be any order of filter in order to obtain the desired filtering behavior. In an example where filter 140 is a first order low pass filter, the Nth coefficient ctap(N) can be represented as:

$$Gm(N) \times RL \times \left(1 - e^{-\frac{Tb}{\tau}}\right),$$

where Gm(N) represents the gain of the transconductance stage for the Nth tap, RL represents a resistance of resistor RL, Tb represents a bit period for the input signal Vin 105, and τ represents a time constant for filter 140. The time constant τ for filter 140 can be chosen based on the channel loss characteristics. The higher order coefficient ctap(n) where n is greater than N can be represented as:

$$Gm(N) \times RL \times \left(1 - e^{-\frac{Tb}{\tau}}\right)\left(e^{-\frac{nTb}{\tau}}\right).$$

In an example where filter 140 is a first order high pass filter, the Nth coefficient ctap(N) can be represented as:

$$Gm(N) \times RL \times \left(e^{-\frac{Tb}{\tau}}\right),$$

where Gm(N) represents the gain of the transconductance stage before the Nth tap. The higher order coefficient ctap(n) where n is greater than N can be represented as:

$$Gm(N) \times RL \times \left(-\left(e^{-\frac{nTb}{\tau}}\right)\right)\left(1 - e^{-\frac{Tb}{\tau}}\right).$$

Figure 3A:
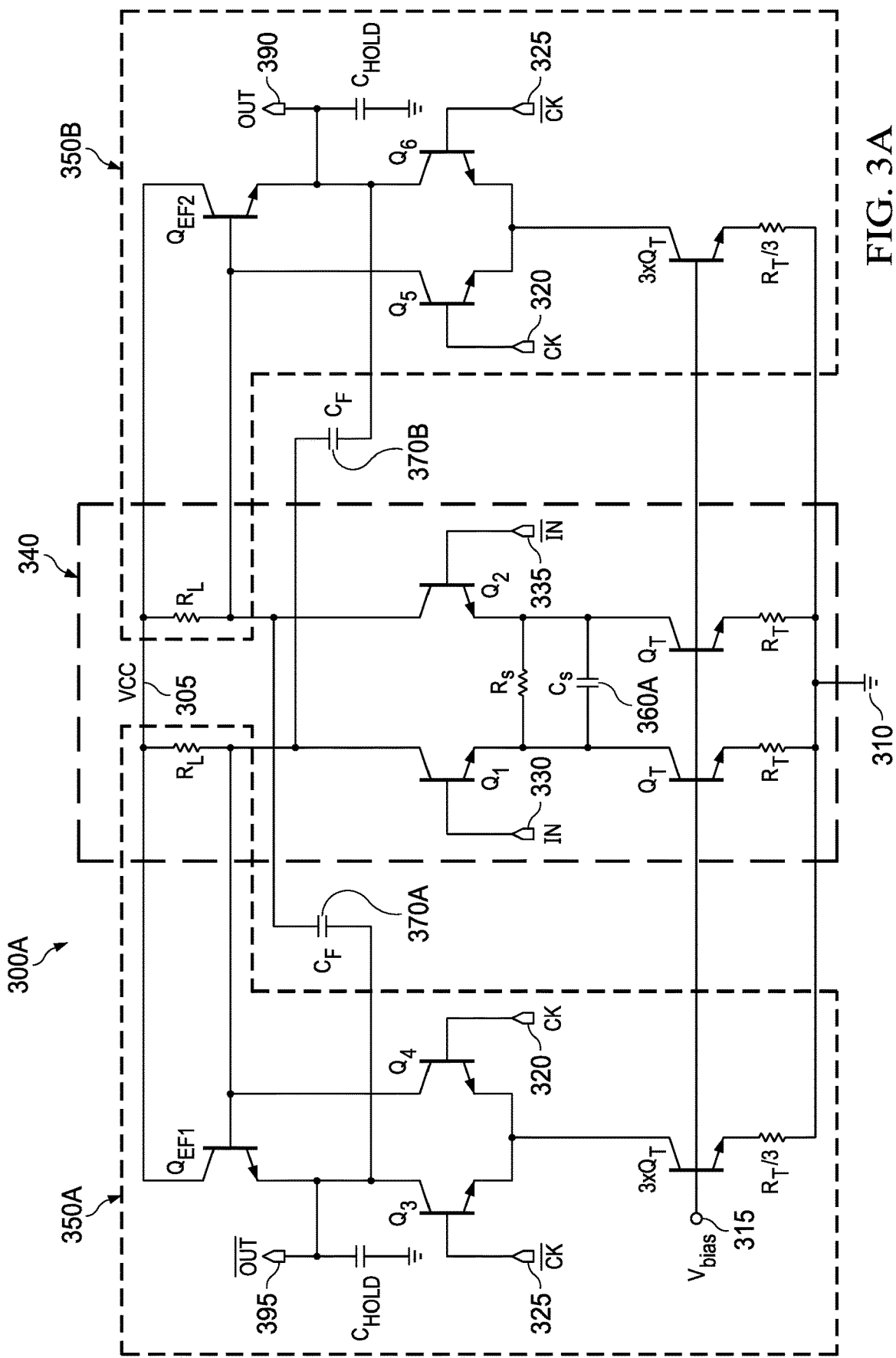
FIGS. 3A-3B illustrate a track-and-hold amplifier for use in a sample-and-hold circuit included in the feedforward equalizer shown in FIG. 1.
Figure 3B:
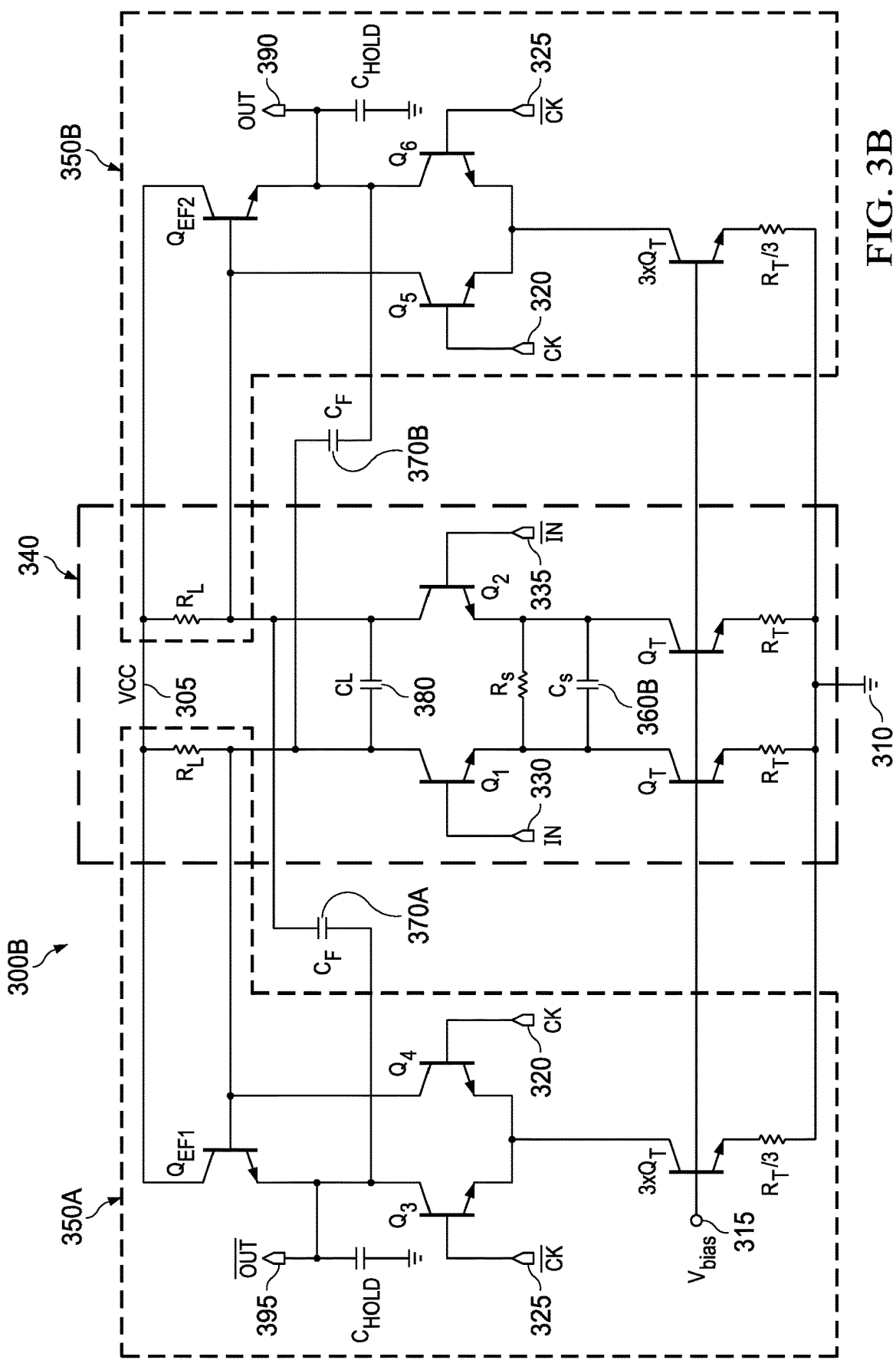

FIGS. 3A-B illustrate an example track-and-hold (T/H) amplifier 300 for use in a S/H circuit such as S/H circuits 120, 130, and 150 included in the feedforward equalizer 100 shown in FIG. 1. T/H amplifier 300 includes a preamplifier 340 with two switched emitter followers 350A-B. In FIG. 3A, preamplifier 340 includes a degeneration capacitor Cs 360A coupled in parallel with the degeneration resistor Rs. Preamplifier 340 exhibits a pole at approximately:

$$\frac{1}{(RL)(C1)},$$

where C1 represents an input capacitance of the switched emitter follower 350A or 350B, and a pole at approximately:

$$\frac{1 + \frac{GmRs}{2}}{RsCs},$$

where Gm represents the transconductance of the transistors Q1 and Q2. Preamplifier 340 exhibits a zero at $$\frac{1}{(Rs)(Cs)}.$$

The capacitance of Cs 360A can be chosen such that the zero at $$\frac{1}{(Rs)(Cs)}$$

cancels out the pole at $$\frac{1}{(RL)(C1)},$$

extending the bandwidth of T/H amplifier 300A. Feedforward capacitors Cf 370A-B are coupled between preamplifier 340 and switched emitter followers 350A-B, respectively, and cancel or reduce hold mode feedthrough by opposing the effect of the base-emitter capacitance of transistors QEF1,2 respectively.

FIG. 3B illustrates a master T/H amplifier for S/H circuit 150, which can be reconfigured such that preamplifier 340 incorporates the filtering behavior of filter 140 and removes the need for a separate filtering circuit 140. In one configuration, the preamplifier 340 in the master T/H amplifier 300B omits the degeneration capacitor Cs 360B. In another configuration, the preamplifier 340 in the master T/H amplifier 300B includes the degeneration capacitor Cs 360B and an additional capacitor CL 380 coupled between the feedforward capacitors Cf 370A-B. In both configurations, the preamplifier 340 acts as the filter 140 in addition to part of the master T/H amplifier for S/H circuit 150.

The term "couple" is used throughout the specification. The term may cover connections, communications, or signal paths that enable a functional relationship consistent with the description of the present disclosure. For example, if device A generates a signal to control device B to perform an action, in a first example device A is coupled to device B, or in a second example device A is coupled to device B through intervening component C if intervening component C does not substantially alter the functional relationship between device A and device B such that device B is controlled by device A via the control signal generated by device A.

Modifications are possible in the described embodiments, and other embodiments are possible, within the scope of the claims.

What is claimed is:

1. A feedforward equalizer (FFE), comprising:
   a set of N FFE taps coupled together in parallel, wherein each FFE tap of the N FFE taps comprises:
      a unique sample-and-hold (S/H) circuit configured to generate a unique time-delayed signal; and
      a unique transconductance stage configured to generate a unique transconductance output based on the unique time-delayed signal;
   a filter coupled between the (N−1)th FFE tap and the Nth FFE tap; and
   a summer coupled to an output of the set of N FFE taps.

2. The FFE of claim 1, wherein the filter comprises a first order high pass filter such that coefficients greater than N have an opposite polarity to an Nth coefficient.

3. The FFE of claim 1, wherein the filter comprises a first order low pass filter such that coefficients greater than N have a same polarity as an Nth coefficient.

4. The FFE of claim 1, wherein a particular S/H circuit in a particular FFE tap comprises a first track-and-hold (T/H) circuit and a second T/H circuit.

5. The FFE of claim 4, wherein at least one of the first and second T/H circuits in the particular S/H circuit comprises:
 a preamplifier; and
 a switched emitter follower.

6. The FFE of claim 5, wherein the preamplifier comprises a degeneration capacitor, wherein a capacitance of the degeneration capacitor is chosen to extend a bandwidth of the preamplifier.

7. The FFE of claim 5, wherein the at least one of the first and second T/H circuits further comprises a feedforward capacitor coupled between the preamplifier and the switched emitter follower, wherein a capacitance of the feedforward capacitor is chosen to reduce hold mode feedthrough.

8. The FFE of claim 5, wherein the particular FFE tap is the Nth FFE tap, wherein the particular S/H circuit is the Nth S/H circuit, wherein the at least one of the first and second T/H circuits is the first T/H circuit, wherein the preamplifier further comprises the filter coupled between the (N−1)th FFE tap and the Nth FFE tap.

9. The FFE of claim 8, wherein the preamplifier comprises a filtering capacitor.

10. An apparatus, comprising:
 a set of N sample-and-hold (S/H) circuits coupled together in series;
 a filter coupled between the (N−1)th S/H circuit and the Nth S/H circuit;
 a set of N transconductance stages, wherein each transconductance stage is coupled to an output of a unique S/H circuit in the N S/H circuits; and
 a summer coupled to outputs of the N transconductance stages.

11. The apparatus of claim 10, wherein the filter comprises a first order high pass filter such that coefficients greater than N have an opposite polarity to an Nth coefficient.

12. The apparatus of claim 10, wherein the filter comprises a first order low pass filter such that coefficients greater than N have a same polarity as an Nth coefficient.

13. The apparatus of claim 10, wherein a S/H circuit in the set of N S/H circuits comprises a track-and-hold (T/H) circuit.

14. The apparatus of claim 10, wherein the T/H circuit comprises:
 a preamplifier coupled to an input of the T/H circuit; and
 a switched emitter follower coupled to an output of the preamplifier and to an output of the T/H circuit.

15. The apparatus of claim 14, wherein the preamplifier comprises a degeneration capacitor, and wherein the T/H circuit further comprises a feedforward capacitor coupled between the preamplifier and the switched emitter follower.

16. The apparatus of claim 14, wherein the S/H circuit is the Nth S/H circuit, wherein the preamplifier further comprises the filter.

17. A feedforward equalizer (FFE), comprising:
 a first sample and hold (S/H) circuit configured to receive an input signal and a clock signal and to output a first retimed signal;
 a first amplifier configured to receive the first retimed signal and to output a first weighted signal;
 a second S/H circuit configured to receive the first retimed signal and the clock signal and to output a second retimed signal;
 a second amplifier configured to receive the second retimed signal and to output a second weighted signal;
 a filter configured to receive the second retimed signal and to output a filtered signal;
 a third S/H circuit configured to receive the filtered signal and the clock signal and to output a third retimed signal;
 a third amplifier configured to receive the third retimed signal and to output a third weighted signal; and
 a summer configured to combine the first, second, and third weighted signals.

18. The FFE of claim 17, wherein the filter comprises a first order high pass filter such that an equalization of the FFE is greater than three taps, wherein higher order coefficients beyond a third coefficient have an opposite polarity to the third coefficient.

19. The FFE of claim 17, wherein the filter comprises a first order low pass filter such that an equalization of the FFE is greater than three taps, wherein higher order coefficients beyond a third coefficient have a same polarity as the third coefficient.

20. The FFE of claim 17, wherein the third S/H circuit comprises a master track-and-hold (T/H) circuit and a slave T/H circuit.

21. The FFE of claim 20, wherein the master T/H circuit comprises:
 a preamplifier, wherein the preamplifier comprises the filter; and
 a switched emitter follower.

22. The FFE of claim 21, wherein the preamplifier further comprises a degeneration capacitor, wherein the master T/H circuit further comprises a feedforward capacitor coupled between the preamplifier and the switched emitter follower.

* * * * *